(12) United States Patent
Popa et al.

(10) Patent No.: US 8,865,845 B2
(45) Date of Patent: Oct. 21, 2014

(54) SILSEQUIOXANE-TITANIA HYBRID POLYMERS

(75) Inventors: Paul J. Popa, Auburn, MI (US); Lynne K. Mills, Midland, MI (US); Kevin E. Howard, Midland, MI (US)

(73) Assignee: Dow Global Technologies LLC

( * ) Notice: Subject to any disclaimer, the term of this patent is extended or adjusted under 35 U.S.C. 154(b) by 1462 days.

(21) Appl. No.: 12/091,811

(22) PCT Filed: Oct. 25, 2006

(86) PCT No.: PCT/US2006/041662
§ 371 (c)(1),
(2), (4) Date: Nov. 3, 2009

(87) PCT Pub. No.: WO2007/053396
PCT Pub. Date: May 10, 2007

(65) Prior Publication Data
US 2010/0221666 A1 Sep. 2, 2010

Related U.S. Application Data

(60) Provisional application No. 60/731,536, filed on Oct. 28, 2005.

(51) Int. Cl.
*C08F 283/12* (2006.01)
*G03F 7/09* (2006.01)
*C08G 77/58* (2006.01)
*G03F 7/075* (2006.01)

(52) U.S. Cl.
CPC .............. *G03F 7/091* (2013.01); *G03F 7/0757* (2013.01); *C08G 77/58* (2013.01)
USPC .......................................... 525/475; 525/474

(58) Field of Classification Search
CPC . G03F 7/2043; G03F 7/2041; G03F 7/70341; G03F 525/475; G03F 525/474
USPC .................................. 525/475, 474
See application file for complete search history.

(56) References Cited

U.S. PATENT DOCUMENTS

| 3,615,272 | A | 10/1971 | Collins et al. |
| 5,100,503 | A | 3/1992 | Allman et al. |
| 5,484,867 | A * | 1/1996 | Lichtenhan et al. ............... 528/9 |
| 5,973,095 | A | 10/1999 | Hacker et al. |
| 6,268,457 | B1 | 7/2001 | Kennedy et al. |
| 6,420,088 | B1 | 7/2002 | Angelopoulos et al. |
| 6,514,667 | B2 | 2/2003 | Angelopoulos et al. |
| 6,891,237 | B1 | 5/2005 | Bao et al. |
| 2002/0128388 | A1 | 9/2002 | Kennedy et al. |
| 2004/0048194 | A1 | 3/2004 | Breyta et al. |
| 2005/0112383 | A1 | 5/2005 | Tanaka et al. |

FOREIGN PATENT DOCUMENTS

TW 593455 6/2004

OTHER PUBLICATIONS

Chen, et al., "Synthesis and characterization of oligomeric phenylsilsesquioxane-titania hybrid optical thin films", Materials Chemistry and Physics 2004, p. 71-77, vol. 83 (Disclosure, Specification, PCT Search Report and IPRP).
Wada, et al., "Synthesis of Cooligomers of Titanium-Bridged Silsesquioxanes and Octakis(hydridosilsesquioxane)", The Chemical Society of Japan, 2000, p. 1232-1233 (PCT search report).
Kunz, et al., "Materials evaluation of anti-reflective coatings for single layer 193 nm lithography", SPIE, (1994) 2195, 447-460.
Lin, et al., "Anti-reflective Coatings, a Story of Interfaces", Semiconductor International, (1999), vol. 3678, 55-60.
Lin, et al., "Dual layer Inorganic SiON Bottom ARC for 0.25um DUV Hard Mask Applications", SPIE, (2000), 246.
Dammel, "Anti-reflective Coatings; Theory and Practice", SPIE, (2004), 118.
Chen, et al., "Synthesis and characterization of poly(methyl silsesquioxane)—titania optical thin films", J. Mater. Chem., 2002, 12, abstratct.

* cited by examiner

*Primary Examiner* — Daborah Chacko Davis

(57) ABSTRACT

The invention relates to silsesquioxane-titania hybrid polymers, wherein the titania domain size is less than about five nanometers. Such polymers are useful, for example, to form anti-reflection coatings in the fabrication of microelectronic devices.

13 Claims, No Drawings

SILSEQUIOXANE-TITANIA HYBRID POLYMERS

CROSS REFERENCE TO RELATED APPLICATIONS

This application is a 371 of PCT/US2006/041662 filed Oct. 25, 2006, which claims the benefit of U.S. Provisional Application Ser. No. 60/731,536, filed Oct. 28, 2005.

BACKGROUND OF THE INVENTION

The instant invention relates to silsesquioxane-titania hybrid polymers useful to form anti-reflective coatings in the microelectronics fabrication industry.

The microelectronics fabrication industry is moving toward smaller geometries in its devices to enable lower power and faster speeds. As the conductor lines become finer and more closely packed, more challenges are introduced into manufacturing of semiconductor devices. One of the most important of these manufacturing processes is photolithography.

Linewidth variations in patterns produced by photolithography can result from optical interference from light reflecting off an underlying layer in a semiconductor device. Variations in photoresist thickness due to topography of the underlying layers can also induce linewidth variations. Bottom anti-reflective coatings (BARC) applied under a photoresist layer have been used to prevent interference from reflection of the irradiating beam. In addition, if a planarizing anti-reflective coating is selected, surface topography can be reduced by the application of the BARC film, thereby, improving photoresist uniformity which also results in improved (reduced) linewidth variation.

For some lithographic processes, especially at finer integration nodes where line widths become even smaller, photoresists are no longer able to provide sufficient etch resistance to enable effective pattern transfer to the layer underneath the resist. In many instances (e.g., where a very thin photoresist layer is required, where the underlayer material is very thick, where deep etching is required, or where the composition of the photoresist and BARC and/or underlayer material are very similar in chemical nature), a hardmask layer may be employed as an intermediate layer between the resist, BARC (if used) and underlying layer (i.e. dielectric layer, silicon, polysilicon, etc.) to be patterned. The hardmask layer receives the pattern from the patterned resist and is able to withstand the etching processes needed to transfer the pattern to the underlayer. In the most desirable case, the hardmask layer and BARC layer can be combined as one to simplify the integration process and lower manufacturing costs.

Dual damascene integration schemes are now also being used to reduce manufacturing costs in the back end of the line (BEOL) of fabrication. The lithographic processes required for dual damascene integration add another degree of complexity to photolithography. Unlike conventional (single damascene) processes, which require only patterning of vias, the process for making dual damascene structures also requires patterning of line/space combinations for trenches that will be etched into relatively thick transparent layers of dielectrics. In order to ensure that barrier layers used, for example, to prevent copper (or alternate metal) oxidation or act as an etch stop, are not etched clear during the dielectric etch, sufficient selectivity between the barrier layer (i.e. silicon nitride) and dielectric material (i.e. silicon dioxide) is required. Unfortunately, the etch selectivity requirements often result in poor etch profiles and/or polymer build-up in the vias and trenches.

One method of mitigating this problem is to fill the etched via with an etch-resistant material prior to trench patterning and etch. This prevents the barrier layer material from being exposed to etch gases during the dielectric trench etch. Organic gap-fill materials, such as photoresists or organic BARCs, can be used in this application. However, when inorganic dielectric materials are used etch defects can result due to the differences in etch rates between the organic fill material and the inorganic dielectric. Elimination of these defects without damaging barrier layers can be difficult.

Many hardmask, anti-reflective coatings and gap-fill materials have been described in the literature and prior art, however, none of these materials provide a perfect solution to the problems faced during state-of-the-art lithography processes. In the worst of cases, single solution materials are used, resulting in increased manufacturing complexity and costs. Many of the prior art materials that provide dual- or multi-functionality are difficult to apply to substrates, e.g., they must be applied using chemical or physical vapor deposition and/or require high temperature baking after deposition which is incompatible with photoresist processing. Many of these materials also either do not provide reflection control or only control reflection through destructive interference of the reflected light. This results in stringent thickness and uniformity controls on the films. It is, therefore, desirable from a manufacturability standpoint to have anti-reflective coatings/ hardmask compositions which provide both masking and true anti-reflective properties (i.e. through absorption and interference rather than solely by interference). It is further desired that these coatings be applied using spin-coating and thermal treatment techniques that are compatible with typical photoresist processes. Furthermore, the material should have sufficient etch selectivity with regard to the overlying photoresist. In the case of dual damascene integration schemes, the coating should also be able to fill vias and have similar etch characteristics to the trench dielectric material while being selective to any metal barrier layers.

Anti-reflective coatings can be used on top of (TARC) or directly underneath (BARC) a layer of photoresist to minimize the amount of non-imaging light that is reflected during the photolithography process by absorption and/or destructive interference. The minimization of non-imaging light reflections can result in an improvement (minimization) in line-width variations and reduced line edge roughness (LER) of the imaged photoresist, thereby, improving critical dimension (CD) control.

Anti-reflective coating layers and techniques for their incorporation in electronic devices are disclosed in the following references: "Materials evaluation of anti-reflective coatings for single layer 193 nm lithography", Kunz, R. R., et al, SPIE, (1994) 2195, 447-460; "Anti-reflective Coatings, a Story of Interfaces", Semiconductor International, (1999), 55-60; Lin, et al., "Dual layer Inorganic SiON Bottom ARC for 0.25 um DUV Hard Mask Applications, SPIE, (2000), 246; "Anti-reflective Coatings; Theory and Practice", SPIE, (2004), 118.

Silsesquioxane resins are well known in the microelectronics art; see, for example, U.S. Pat. Nos. 6,891,237, 3,615,272 and 5,973,095. The polymer films produced from these resins, however, generally do not exhibit the anti-reflective properties required for BARC applications at, for instance, 248 nm and 193 nm imaging wavelengths. In order to provide BARC functionality, a chromophore species, often referred to as a dye, must be added to the system. The dye is chosen to give the proper absorption over the imaging wavelengths used during photolithography. In general, these dye phases are not incorporated directly into the polymer backbone. Rather they are added as an additive to the final BARC formulation and are not bound to a side chain in the polymer structure and/or are not covalently bonded to the polymer network. Examples of such dyed hybrid BARC systems have been described in U.S. Pat. No. 6,420,088, and US Publication No. 2002/0128388.

Adequate absorption at 248 nm may be obtained by incorporating species such as anthracene or naphthalene into the polymer matrix, as described, for example in U.S. Pat. No. 6,268,457. While these species will add the desired level of 248 nm absorption to help control reflectivity, they can reduce the inorganic content of the final films. This may negatively impact hardmask properties such as etch selectivity. In addition, these species are often only weakly bound into the polymer network, resulting in difficulties controlling the stability of films produced from such systems. Stability issues manifest themselves in property drift, such as etch rates and extinction coefficients, as a function of film age, especially when films are exposed to ambient light and environments.

Synthesis of silsesquioxane-titania hybrid polymers useful to form anti-reflective coatings in the microelectronics fabrication industry is known; see, for example, Chen et al., *Materials Chemistry and Physics*, 83 (2004) 71-77 herein fully incorporated by reference. Such formulations are advantaged over those which utilize organic chromophores in that the inorganic content is not compromised by the addition of the chromophore species. However, the titania domain size of the prior art silsesquioxane-titania hybrid polymers is relatively large and limits the usefulness of such polymers to form anti-reflective coatings in advanced integration nodes (feature sizes below 180 nm) in the microelectronics fabrication industry. Other silsequioxane-titania hybrid polymer systems are described in U.S. Pat. No. 5,100,503, but the titania species in these polymers are not bound into the polymer network, allowing the chromophore phase to be readily filtered out during standard processing, thereby, greatly reducing, or even eliminating the desired 248 nm adsorbing species.

SUMMARY OF THE INVENTION

The instant invention provides a solution to the above-mentioned problems. In one embodiment, the instant invention is a silsesquioxane-titania hybrid polymer having a titania domain size of less than about five nanometers. In another embodiment, the instant invention is a substrate coated with a coating comprising a silsesquioxane-titania hybrid polymer having a titania domain size of less than about five nanometers. In another embodiment, the instant invention is a free-standing film comprising a silsesquioxane-titania hybrid polymer having a titania domain size of less than about five nanometers.

In another embodiment, the instant invention is a method for producing a silsesquioxane-titania hybrid polymer, comprising combining solutions of an organo-titanate in aprotic solvent with a silsesquioxane polymer in aprotic solution where one of the solutions is added to the other solution to form an intermediate where the organo-titanate having the formula $(RO)_4Ti$, wherein R is an alkyl, aryl or alkaryl group having from 1-20 carbons and optionally containing one or more heteroatoms, provided that when the organo-titanate solution is added to the silsesquioxane polymer solution the silsesquioxane polymer has a weight average molecular weight of less than 1100 grams; and adding water to the intermediate to form the silsesquioxane-titania hybrid polymer. Thus, in one preferred embodiment the method comprises the steps of: adding a solution of an organo-titanate in an aprotic solvent to a solution of a silsesquioxane polymer in an aprotic solvent to form an intermediate, the organo-titanate having the formula $(RO)_4Ti$, wherein R is an alkyl, aryl or alkaryl group having from 1-20 carbons and optionally containing one or more heteroatoms, the silsesquioxane polymer having a weight-average molecular weight of less than 1100 grams per mole; and adding water to the intermediate to form the silsesquioxane-titania hybrid polymer. In another embodiment, the instant invention is a coating comprising a silsesquioxane-titania hybrid polymer made according to the method of this paragraph. In another embodiment, the instant invention is a silsesquioxane-titania hybrid polymer made according to the method of this paragraph. In another embodiment, the instant invention is a microelectronic device or a nascent microelectronic device (i.e. a microelectronic device in the process of its manufacture) comprising a silsesquioxane-titania hybrid polymer made according to the method of this paragraph.

In another embodiment, the instant invention is a method for producing a silsesquioxane-titania hybrid polymer, comprising the steps of: adding a solution of a silsesquioxane polymer in an aprotic solvent to a solution of an organo-titanate in an aprotic solvent to form an intermediate, the organo-titanate having the formula $(RO)_4Ti$, wherein R is an alkyl, aryl or alkaryl group having from 1-20 carbons and optionally containing one or more heteroatoms; and adding water to the intermediate to form the silsesquioxane-titania hybrid polymer. In another embodiment, the instant invention is a coating comprising a silsesquioxane-titania hybrid polymer made according to the method of this paragraph. In another embodiment, the instant invention is a silsesquioxane-titania hybrid polymer made according to the method of this paragraph. In another embodiment, the instant invention is a nascent microelectronic device comprising a silsesquioxane-titania hybrid polymer made according to the method of this paragraph.

In another embodiment, the instant invention is a method for producing a silsesquioxane-titania hybrid polymer, comprising the steps of: mixing an organo-titanate, one or more organo-silanes, water and acid to form the silsesquioxane-titania hybrid polymer, the organo-titanate having the formula $(RO)_4Ti$, wherein R is an alkyl, aryl or alkaryl group having from 1-20 carbons and optionally containing one or more heteroatoms, the one or more organo-silanes having the formula $X_aSiZ_{4-a}$ wherein a is 1 or 2 or 3, provided in at least some of the organo-silane a is 1; wherein X is an alkyl, alkenyl, aryl or alkaryl group having from 1-20 carbons and optionally containing one or more heteroatoms; and wherein Z is hydroxy or a hydrolyzable group and can be the same or different in each occurrence on the organo-silane compound. In another embodiment, the instant invention is a coating comprising a silsesquioxane-titania hybrid polymer made according to the method of this paragraph. In another embodiment, the instant invention is a silsesquioxane-titania hybrid polymer made according to the method of this paragraph. In another embodiment, the instant invention is a nascent microelectronic device comprising a silsesquioxane-titania hybrid polymer made according to the method of this paragraph.

In another embodiment, the instant invention is an improved photolithography process for forming the wiring pattern for a microelectronic device, comprising the steps of: coating a dielectric coated silicon wafer with an anti-reflective coating; forming a pattern of a photoresist material on the anti-reflective coating, thereby, leaving a portion of the anti-reflective coating exposed; etching the exposed anti-reflective coating, wherein the improvement comprises the anti-reflective coating comprising a silsesquioxane-titania hybrid polymer made according to the methods of the instant invention.

In another embodiment, the instant invention is an improved photolithography process for forming the wiring pattern for a microelectronic device, comprising the steps of: coating a dielectric coated silicon wafer with an anti-reflective coating; forming a pattern of a photoresist material on the anti-reflective coating, thereby, leaving a portion of the anti-reflective coating exposed; etching the exposed anti-reflective coating, wherein the improvement comprises the anti-reflective coating comprising a silsesquioxane-titania hybrid polymer having a titania domain size of less than about five nanometers.

DETAILED DESCRIPTION

The instant invention in one embodiment is a silsesquioxane-titania hybrid polymer having a titania domain size of less than about five nanometers. The instant invention in another embodiment is a substrate, such as a nascent microelectronic device, coated with a silsesquioxane-titania hybrid polymer having a titania domain size of less than about five nanometers. The instant invention in yet another embodiment is a free-standing film comprising a silsesquioxane-titania hybrid polymer having a titania domain size of less than about five nanometers.

The instant invention in another embodiment is a method for producing a silsesquioxane-titania hybrid polymer, comprising two steps. The first step is to add a solution of an organo-titanate in an aprotic solvent to a solution of a silsesquioxane polymer in an aprotic solvent to form an intermediate, the organo-titanate having the formula $(RO)_4Ti$, wherein R is an alkyl, aryl or alkaryl group having from 1-20 carbons and optionally containing one or more heteroatoms, the silsesquioxane polymer having a weight average molecular weight of less than 1100 grams per mole. The second step is to add water to the intermediate to form the silsesquioxane-titania hybrid polymer. Preferably, the silsesquioxane polymer comprises alkenyl (such as vinyl) and aryl (such as phenyl) groups. Examples of the organo-titanate include: tetraethyl titanate, tetraisopropyl titanate, tetra-n-propyl titanate, tetra-n-butyl titanate, tetraisooctyl titanate, tetraisostearoyl titanate, tetraoctyleneglycol titanate, ethoxybis(pentane-2,4-dionato-0,0')(propan-2-olato) titanium, and titanium tetrabutanolate polymer. A preferred organo titanate is tetra-n-butyl titanate. Examples of aprotic solvents include: ethers such as tetrahydrofuran (THF), ethylene glycol dimethyl ether; ketones such as methylethyl ketone, methylisobutyl ketone; and esters such as butyl acetate, and propylene glycol methyl ether acetate (PGMEA). Preferred aprotic solvents are THF, ethylene glycol dimethyl ether, and, most preferred, PGMEA. Typically, the organo-titanate solution is slowly added to the silsesquioxane polymer over a period of time at a temperature between 60-100° C., preferably 70° C. Typically, the water is also slowly added to the intermediate over a period of time at a temperature between 60-100° C., preferably 70° C. Optionally, some of the aprotic solvent can be distilled from the silsesquioxane-titania hybrid polymer solution. The silsesquioxane-titania hybrid polymer solution is then, typically, filtered and coated onto a nascent device as an anti-reflective coating for photo-lithographic processing of the device. Typically, the coating process is spin-coating, spray coating, dip coating or scan coating, most preferably, spin-coating, followed by evaporation of the PGMEA to leave a solid coating of the silsesquioxane-titania hybrid polymer on the device. The silsesquioxane-titania hybrid polymer coating when viewed using Transmission Electron Microscopy (TEM), typically, shows titania domains having an average diameter of less than about five nanometers. Silsesquioxane-titania hybrid polymers having titania domains less than about five nanometers have enhanced UV light absorption characteristics and processing properties when used as an anti-reflective coating in the manufacture of microelectronic devices. This small titania domain size is especially preferred in advanced integration nodes to minimize defectivity and improve film uniformity and coating quality when line spacings are ≤0.25 um. Silsesquioxane polymers of various types and various molecular weight ranges are commercially available or can be prepared by well-known procedures including the procedures outlined below. The molecular weight of the silsesquioxane polymer is determined by Size Exclusion Chromatography.

In another embodiment, the instant invention is a method for producing a silsesquioxane-titania hybrid polymer, comprising two steps. The first step is to add a solution of a silsesquioxane polymer in an aprotic solvent to a solution of an organo-titanate in an aprotic solvent to form an intermediate, the organo-titanate having the formula $(RO)_4Ti$, wherein R is an alkyl, aryl or alkaryl group having from 1-20 carbons and optionally containing one or more heteroatoms. The second step is to add water to the intermediate to form the silsesquioxane-titania hybrid polymer. A preferred organo titanate is tetra n-butyl titanate. A preferred aprotic solvent is PGMEA. Typically, the silsesquioxane polymer solution is slowly added to the organo-titanate solution over a period of time at a temperature between 60-100° C., preferably 70° C. Typically, the water is also slowly added to the intermediate over a period of time at a temperature between 60-100° C., preferably 70° C. Optionally, some of the aprotic solvent can be distilled from the silsesquioxane-titania hybrid polymer solution. The silsesquioxane-titania hybrid polymer solution is then, typically, filtered and coated onto a nascent microelectronic device as an anti-reflective coating for photo-lithographic processing of the device. Typically, the coating process is spin-coating, spray coating, dip coating or scan coating, most preferably spin-coating, followed by evaporation of the PGMEA to leave a solid coating of the silsesquioxane-titania hybrid polymer on the device. The silsesquioxane-titania hybrid polymer coating when viewed using Transmission Electron Microscopy (TEM) typically shows titania domains having an average diameter of less than about five nanometers. Silsesquioxane-titania hybrid polymers having titania domains less than about five nanometers have enhanced the photometric and processing properties when used as an anti-reflective coating in the manufacture of microelectronic devices. This small titania domain size is especially preferred in advanced integration nodes to minimize defectivity and improve film uniformity and coating quality when line spacings are ≤0.25 μm. Silsesquioxane polymers of various types and various molecular weight ranges are commercially available or can be prepared by well-known procedures including the procedures outlined below. The molecular weight of the silsesquioxane polymer is determined by Size Exclusion Chromatography. Preferably, the silsesquioxane polymer has a weight average molecular weight of more than 1000 grams per mole. Preferably, the silsesquioxane polymer has a weight average molecular weight of less than than 30,000 grams per mole. Most preferably, the silsesquioxane polymer has a weight average molecular weight in the range of from 1,700 to 12,000 grams per mole.

Silsesquioxane polymers for use in the instant invention can be prepared by the hydrolysis and polymerization of one or more organo-silanes having the formula $X_aSiZ_{4-a}$ wherein a is 1 or 2 or 3, provided in at least some of the organo-silane a is 1; wherein X is an alkyl, alkenyl, aryl or alkaryl group having from 1-20 carbons and optionally containing one or more heteroatoms; and wherein Z is hydroxy or a hydrolyzable group and can be the same or different in each occurrence on the organo-silane compound. The hydrolysis and polymerization can be carried out by either slow addition of a mixture of the silanes to a sufficient amount of acidified water to adequately hydrolyze the silanes such that little to no residual hydrolyzable groups remain bonded to silicon or by the slow addition of a sufficient amount of acidified water to adequately hydrolyze the silanes such that little to no residual hydrolyzable groups remains bonded to silicon.

The manufacture of the hydrolyzed organosilane composition can be adjusted to give the properties desired, such as control of molecular weight and/or polymer architecture (for example, block copolymers and random copolymers). When combinations of organosilanes are used and one of the organosilanes is significantly more reactive than the other, it is preferable to continuously add the more reactive species during the hydrolysis reaction. This ensures that the residuals of both types of silanes are more uniformly distributed throughout the resulting oligomer or polymer. The rate of addition is adjusted to provide the desired mixture of residuals of the silanes in the resulting polymer. As used herein, "continuously add" means that the charge of the reactive silane is not added all at once but is rather added in at least several approximately uniform portions or, more preferably, is added uniformly throughout the reaction.

For applications in the microelectronics industry it is best to ensure that the final polymer is high purity in nature, both with regards to particulate contaminants and inorganic (metallic) contaminants. It is, therefore, advantageous to employ a synthesis process which does not result in formation of particulate phases and requires a minimal amount of handling of the product during synthesis. To ensure adequate inorganic purity, the raw materials used during synthesis can be pre-purified to levels below those required for the final product or the final polymer can be purified after synthesis. Since the synthesis process described herein does not contain isolation steps or processes such as solvent exchanges through resin beds which can result in cross-contamination, it is advantageous to use pre-purified raw materials over post-purification of the final product. The raw material purification methods which may be used may include but are not limited to distillation, chromatography, solvent extraction or membrane separation.

The hydrolysis is carried out at a temperature in the range from about 0° C. to 40° C., preferably, from about 15° C. to about 40° C. and, more preferably, to about 25° C. Examples of suitable acids to acidify the water include Brönsted acids such as acetic acid, formic acid, propionic acid, citric acid, hydrochloric acid, sulfuric acid, and phosphoric acid. Preferably, acetic acid or hydrochloric acid is used to acidify the water. The polymerization is carried out by raising the temperature of the hydrolysis mixture to a temperature sufficient to cause polymerization within the desired reaction time. This temperature is, preferably, above 60° C., more preferably, from 70° C. to 150° C. and, most preferably, from 90° C. to 110° C.

The formation of the polymer resin results in the creation of hydrolysis by-products such as ethanol, methanol, isopropanol, and water. These by-products are advantageously removed while polymerization occurs by heat or in vacuo or a combination thereof, preferably with the aid of a solvent, which, as used herein, refers to one or more solvents. Examples of such solvents include $C_{5-12}$ linear, branched, or cyclic alkanes such as hexane, heptane, and cyclohexane; ethers such as tetrahydrofuran, dioxane, ethylene glycol diethyl ether, and ethylene glycol dimethyl ether; ketones such as methyl isobutyl ketone, methyl ethyl ketone, and cyclohexanone; esters such as butyl acetate, ethyl lactate and propylene glycol methyl ether acetate; halogenated solvents such as trichloroethane, bromobenzene, and chlorobenzene; and silicone solvents such as octamethylcyclotetrasiloxane and decamethylcyclopentasiloxane; and combinations thereof. A preferred solvent has a boiling point at least as high as that of the highest boiling hydrolysis by-product; preferably, the solvent system contains a solvent having a boiling point of not less than 100° C. A more preferred solvent is a glycol ether ester, such as DOWANOL™ PMA propylene glycol methyl ether acetate (a trademark of The Dow Chemical Company) also termed "PGMEA" herein. The concentration of the polymer in the solvent is application dependent, but is generally in the range of from about 1 to about 75 weight percent, based on the weight of the polymer and the solvent.

Examples of hydrolyzable groups Z include halogens such as Cl, F, Br, I; alkoxy groups such as methoxy, ethoxy, isopropoxy, butoxy, hexyloxy, etc; alkenyloxy such as allyloxy; cycloalkoxy, such as cyclopentoxy or cyclohexyloxy; aryloxy such as phenoxy; cycloalkenyloxy such as cyclopentenyloxy; and acyloxy (e.g. acetoxy). Preferred hydrolyzable groups are alkoxy or acyloxy; more preferably, alkoxy groups. Specific examples of suitable organo-silanes include, without limitation thereto: vinyl triacetoxysilane, vinylmethyl diacetoxysilane, vinyl trimethoxysilane, vinylmethyldimethoxy silane, vinyl triethoxysilane, vinylmethyl diethoxysilane, vinyl triisopropoxysilane, vinyl tributoxysilane, vinylphenyl dimethoxysilane, o-(vinyloxylethyl)-N-(triethoxysilylpropyl) urethane, allyl triacetoxysilane, allylmethyl diacetoxysilane, allyl trimethoxysilane, allylmethyl dimethoxysilane, allyloxylundecyl trimethoxysilane, allyl triethoxysilane, hexenyl triacetoxysilane, hexenyl trimethoxysilane, hexenyl triethoxysilane, octenyl trimethoxysilane, phenyl triacetoxysilane, phenylmethyl diacetoxysilane, phenyl trimethoxysilane, phenylmethyl dimethoxy silane, phenyl triethoxysilane, phenylmethyl diethoxysilane, phenyl triisopropoxysilane, phenylethyl triacetoxysilane, phenylethyl trimethoxysilane, phenoxypropyl trimethoxysilane, phenoxypropylmethyl dimethoxysilane, phenylaminopropyl trimethoxysilane, phenylbutyl trimethoxysilane, N-1phenyl-ethyl-N'-triethoxysilylpropylurea, phenylpropyl trimethoxysilane, naphthyl trimethoxysilane, naphthylmethyl trimethoxysilane, tolyl trimethoxysilane, tolylmethyl dimethoxysilane, methyl triacetoxysilane, ethyl triacetoxysilane, dimethyl diacetoxysilane, methyl trimethoxysilane, dimethyl dimethoxysilane, methyl triethoxysilane, ethyl trimethoxysilane, diethyl dimethoxysilane, propyl trimethoxysilane, propyl triethoxysilane, butyl trimethoxysilane, γ-glycidyloxypropyl trimethoxysilane, γ-glycidoxypropyl triethoxysilane, β-(3,4-epoxycyclohexyl)-ethyl trimethoxysilane, aminopropyl trimethoxysilane, aminopropyl triethoxysilane, aminoethylaminopropyl trimethoxysilane, aminoethyl aminopropyl triethoxysilane, methacryloxypropyl trimethoxysilane, acryloxypropyl trimethoxysilane, chloropropyl trimethoxysilane, chloroethyl trimethoxysilane, and ureidopropyl trimethoxysilane. Highly preferred herein is a mixture of vinyl trimethoxysilane and phenyl trimethoxysilane.

To improve the purity of the final product the raw materials may be purified by distillation, chromatography, solvent extraction, membrane separation or other techniques well-known to those skilled in the art. If pre-purification of the raw materials is not used, post-purification of the final polymer, using techniques such as membrane separation or solvent precipitation may be employed.

In another embodiment, the instant invention is a method for producing a silsesquioxane-titania hybrid polymer, comprising the steps of: mixing an organo-titanate, one or more organo-silanes (highly preferred is a mixture of vinyl trimethoxysilane and phenyl trimethoxysilane), water and acid to form the silsesquioxane-titania hybrid polymer, the organo-titanate (highly preferred is tetra n-butyl titanate) having the formula $(RO)_4Ti$, wherein R is an alkyl, aryl or alkaryl group having from 1-20 carbons and optionally containing one or more heteroatoms, the one or more organo-silane having the formula $X_aSiZ_{4-a}$ (described in detail above) wherein a is 1 or 2 or 3, provided in at least some of the organo-silane a is 1; wherein X is an alkyl, aryl, alkenyl or alkaryl group having from 1-20 carbons and optionally containing one or more heteroatoms; and wherein Z is hydroxy or a hydrolyzable group and can be the same or different in each occurrence on the organo-silane compound. Preferably, the reaction is carried out in a solvent of PGMEA. A preferred acid is acetic acid. After the ingredients are initially mixed, they are preferably heated to about one hundred degrees Celsius to complete the reactions and to distill off the lower boiling point materials. The silsesquioxane-titania hybrid polymer solution is then, typically, filtered and coated onto a nascent microelectronic device as an anti-reflective coating for photo-lithographic processing of the device. Typically, the coating process is spin-coating, spray coating, dip coating or scan coating, most preferably, spin-coating, followed by evaporation of the PGMEA to leave a solid coating of the silsesquioxane-titania hybrid polymer on the device. The silsesquioxane-titania hybrid polymer coating when viewed using Transmission Electron Microscopy (TEM), typically, shows titania domains having an average diameter of less than about five nanometers. Silsesquioxane-titania hybrid polymers having titania domains less than about five nanometers have enhanced the photometric and processing properties when used as an anti-reflective coating in the manufacture of microelectronic devices. This small titania domain size is especially preferred in advanced integration nodes to minimize defectivity and improve film uniformity and coating quality when line spacings are ≤0.25 µm.

In yet another embodiment, the instant invention is an improved photolithography process for forming the wiring pattern for a microelectronic device. In this regard, reference is made to US Patent Publication 2005/0112383 (herein fully incorporated by reference) for a specific description of the well-known photolithographic process for forming the wiring pattern for a microelectronic device. Referring now to FIG. 1 of the '383 publication, 1a is silicon, 1b is the dielectric layer, layer 2 is the anti-reflective layer, layer 4 is the photoresist pattern wherein the exposed portion of the anti-reflective coating is etched as described therein. The improvement of the instant invention relates to an anti-reflective coating which comprises a silsesquioxane-titania hybrid polymer having titania domains less than about five nanometers. In a related embodiment, the instant invention is a microelectronic device made according to said improved process.

In another embodiment, the instant invention is an improved photolithography process for forming the wiring pattern for a microelectronic device. In this regard, reference is made again to US Patent Application Publication 2005/0112383 for a specific description of the well-known photolighographic process for forming the wiring pattern for a microelectronic device. Referring now to FIG. 1 of the '383 publication, 1a is silicon, 1b is the dielectric layer, layer 2 is the anti-reflective layer, layer 4 is the photoresist pattern wherein the exposed portion of the anti-reflective coating is etched as described therein. The improvement of the instant invention relates to an anti-reflective coating which comprises a silsesquioxane-titania hybrid polymer made according to the teachings of the instant invention. In a related embodiment the instant invention is a microelectronic device made according to said improved process.

Example 1

3.46 g of vinyltrimethoxysilane (VTMS) and 1.98 g of phenyltrimethoxysilane (PTMS) were charged to a flask containing 9.5 g of PGMEA. Water (1.03 g), THF (5.13 g) and concentrated HCl (0.26 g) were added to the mixture of silanes over 35 min. After the addition, the flask was heated in a water bath at 60° C. for 3 hrs. The weight average molecular weight of the resulting silsesquioxane polymer was determined to be about 1050 grams per mole by SEC. Then a mixture of 11.35 g of tetrabutyltitanate (TBT) (0.03338 moles) and 41.34 g of THF was added to the flask over 65 min (the flask was held at 60 degrees C.). Then 0.1 g of water mixed in 8.75 g of THF were added over 1 hr at 60 degrees C. Then 10 g PGMEA was added and a Dean-Stark trap was attached to collect the THF distilled off at 60 degrees C. for 45 minutes. The flask was heated to 80 degrees C. and held for 15 min to remove more THF. The flask was then cooled and the resulting silsesquioxane-titania hybrid polymer solution was filtered through a 2.7 µm syringe filter.

The theoretical $RSiO_{3/2}$ solids were 3.14 g and the theoretical $TiO_2$ solids were 2.67 g. This equates to 45.96% $TiO_2$/54.04% $RSiO_{3/2}$.

The silsesquioxane-titania hybrid polymer solution was diluted to 5.8% solids in PGMEA. 3 ml. of this solution was dispensed through a 0.2 µm syringe filter onto a 4" silicon test wafer spinning at 500 rpm using a conventional spin coater. The spin speed was then accelerated to 3000 rpm and the film was spin-dried for 30 seconds. The dried film was then hot plate baked at 200 degrees C. for 2 minutes in an air environment. The coating quality of the resulting film was good with no indications of phase separation. The film thickness was 798 Angstroms. A nominal one inch by one inch piece of optical quartz was also coated with this solution and hot plate baked using the procedure described above. After baking, the absorbance spectrum of the film is measured using a UV/Vis spectrometer. The extinction coefficient was calculated from the absorbance and thickness of the film and determined to be 0.32 at 248 nanometers.

Example 2

6.96 g of VTMS and 3.97 g of PTMS were charged to a flask with 19 g of PGMEA. Water (2.06 g), THF (10.26 g) and concentrated HCl (0.52 g) were added to the silanes over 30 min. After the addition, the flask was heated and held at 60 degrees C. for 3 hrs. The weight average molecular weight of the resulting silsesquioxane polymer was determined to be about 1050 grams per mole by SEC. Then 45.4 g of tetrabutyltitanate (0.1335 moles) and 165.4 g of THF were mixed and added to the flask over 1 hr (the flask is held at 60 degrees C.). Then 0.4 g of water mixed with 35 g of THF were added over 1 hr at 60 degrees C. After the addition, a Dean-Stark trap was attached and the flask was heated to 80 degrees C. to collect THF. About 160 g of THF was collected. PGMEA was added to the resulting silsesquioxane-titania hybrid polymer solution to produce a solids content of 17.8%. The theoretical $RSiO_{3/2}$ solids were 6.27 g and the theoretical $TiO_2$ solids were 10.68 g. This equates to 63% $TiO_2$/37% $RSiO_{3/2}$. A portion of the silsesquioxane-titania hybrid polymer solution was filtered (2.7 µm) and a portion was not filtered.

Samples of the unfiltered material were used to perform a filtration study to help verify that a grafted copolymer system was being achieved and that TiOx precipitates were not being formed during the reaction. Approximately 20 ml aliquots of the unfiltered material were filtered through a series of syringe filters. These filtered samples were then submitted for x-ray fluorescence analysis (XRF) to determine silicon and titanium contents. In addition, a sample of the 2.7 µm filtered material was filtered through a 0.02 micron filter to determine if any change in oxide composition resulted from the finer filtration step. As shown in the following table, the oxide contents of all samples are statistically equivalent, indicating that there was no TiOx precipitation.

| Sample ID | Filter Size, µm | Si, ppm (+−0.1) | Ti, ppm (+−0.2) | $SiO_2$, % | $TiO_2$, % |
|---|---|---|---|---|---|
| 3245-56-1 | None | 1.3 | 4.4 | 27.7 | 72.3 |
| 3245-56-2 | 1.0 | 1.3 | 4.4 | 27.7 | 72.3 |
| 3245-56-3 | 0.2 | 1.3 | 4.4 | 27.7 | 72.3 |
| 3245-56-4 | 0.02 | 1.2 | 4.2 | 26.7 | 73.3 |

A sample of the filtered silsesquioxane-titania hybrid polymer solution was diluted to 6% solids with PGMEA. A silicon test wafer was coated with the polymer solution and cured as described in EXAMPLE 1. Film quality was good and the thickness of the film was 563 Angstroms. A piece of optical quartz was also coated as described in EXAMPLE 1. The thickness was 473 Angstroms. The extinction coefficient was determined to be 0.53 at 248 nanometers, indicating that the extinction coefficient of films formed from these SiOx-TiOx copolymers can be tuned by adjusting the TiOx fraction in the copolymer solution. The extinction coefficient was determined a week later to be 0.52 at 248 nanometers, indicating that the optical properties of the coating are stable with time. The refractive index of the silsesquioxane-titania hybrid polymer coating was determined to be 1.91 at 248 nanometers and 1.67 at 633 nanometers. The titania domain size of the silsesquioxane-titania hybrid polymer coating was determined to be about two nanometers by TEM.

Example 3

6.96 g of VTMS and 3.97 g of PTMS were charged to a flask with 19 g of PGMEA. Water (2.06 g), methanol (10 g), and concentrated HCl (0.53 g) were added over 30 minutes. Then the flask was heated and held at 70° C. for 3 hrs. Then a Dean-Stark trap was attached to the flask. The flask was heated to 100° C. and held for 10 minutes to collect any alcohols. The weight average molecular weight of the resulting silsesquioxane polymer was less than 1100 grams per mole. 26.8 g of tetra n-butyl titanate and 26.8 g of PGMEA were mixed and added to the flask over 1 hr (during the addition the flask was cooled from 100° C. to 70° C.). After the addition, 0.23 g of water and 20 g of PGMEA are mixed and added over 1 hr (flask still at 70° C.). The resulting silsesquioxane-titania hybrid polymer was diluted with PGMEA to cool, and then filtered through a 2.7 µm syringe filter. The theoretical $RSiO_{3/2}$ solids were 6.31 g and the theoretical $TiO_2$ solids were 6.31 g which equates to 50% $TiO_2$/50% $RSiO_{3/2}$. TEM shows the particle size of the titanium oxide (e.g. TiOx or $TiO_2$ portions of the hybrid polymer) domains of the silsesquioxane-titania hybrid polymer to be 2-4 nm.

Example 4

3.48 g of VTMS and 1.98 g of PTMS were charged to a flask with 10 g of PGMEA. Water (1.03 g), methanol (5 g), and concentrated HCl (0.26 g) are added to the silanes over 30 minutes. After the addition the flask was heated and held at 70° C. for 190 minutes. After holding at 70° C. for 190 minutes, a Dean-Stark trap was attached to the flask. The flask was heated to 100° C. and held for 10 minutes to collect any alcohols. The weight average molecular weight of the resulting silsesquioxane polymer was less than 1100 grams per mole. 24.7 g of tetraoctyleneglycol titanate (TYZOR® OGT) and 24.7 g of PGMEA were mixed and added to the flask over 1 hr (during the addition the flask was cooled from 100° C. to 70° C.). 0.11 g of water and 10 g of PGMEA were mixed and added over 55 minutes (the flask still at 70° C.). The resulting silsesquioxane-titania hybrid polymer was diluted with PGMEA to cool, and filtered through a 2.7 µm syringe filter.

A drop of water was added to a two milliliter aliquot of the filtered silsesquioxane-titania hybrid polymer solution. The solution did not turn hazy indicating that the final product was not water sensitive. When water was added to the polymer solution of EXAMPLE 3 it turned hazy with precipitate formed. The improvement was due to the greater hydrolytic stability of a silsesquioxane-titania hybrid polymer made using TYZOR® OGT versus a silsesquioxane-titania hybrid polymer made using TnBT.

The theoretical $RSiO_{3/2}$ solids are 3.15 g and the theoretical $TiO_2$ solids were 3.15 g which equates to 50% $TiO_2$/50% $RSiO_{3/2}$. TEM analysis of a coating of the silsesquioxane-titania hybrid polymer indicated a titanium oxide domain size of 2-4 nm.

Example 5

6.96 g of VTMS and 3.97 g of PTMS were charged to a flask with 19 g of PGMEA. Water (2.06 g), methanol (10 g), and concentrated HCl (0.53 g) were added to the silanes over 30 minutes. After the addition, the flask was heated and held at 70° C. for 3 hrs. A Dean-Stark trap was attached to the flask. The flask was heated to 100° C. and held for 5 minutes to collect any alcohols. The weight average molecular weight of the resulting silsesquioxane polymer was less than 1100 grams per mole. 32 g of TYZOR® AA-105 (ethoxybis(pentane-2,4-dionato-0,0')(propan-2-olate)titanium) and 32 g of PGMEA were mixed and added to the flask over 1 hr (during the addition the flask cooled from 100° C. to 70° C.). 0.3 g of water and 20 g of PGMEA were mixed and added over 1 hr (the flask still at 70° C.). The silsesquioxane-titania hybrid polymer was diluted with PGMEA to cool, and filtered through a 2.7 µm syringe filter. The theoretical $RSiO_{3/2}$ solids were 6.31 g and the theoretical $TiO_2$ solids were 6.31 g which equates to 50% $TiO_2$/50% $RSiO_{3/2}$.

Example 6

A sample of a silsesquioxane-titanic hybrid polymer solution made as described in EXAMPLE 5 was diluted to nominally 23% solids with PGMEA. The solution was then cast into a nominally 1"×2" Teflon mold and cured at 140° C. to faun a free-standing, transparent film that was crack free.

Example 7

6.96 g of VTMS and 3.97 g of PTMS were charged to a flask with 19 g of PGMEA. Water (2.06 g), methanol (10 g), and concentrated HCl (0.53 g) were added to the silanes over 35 minutes. After the addition, the flask was heated and held at 70° C. for 3 hrs. A Dean-Stark trap was attached to the flask. The flask was heated to 100° C. and held for 10 minutes to collect any alcohols. The weight average molecular weight of the resulting silsesquioxane polymer was determined to be about 700 grams per mole by SEC. 12.73 g of TYZOR® BTP (titanium tetrabutanolate polymer) and 15 g of n-butanol were mixed and added to the flask over 1 hr (during the addition the flask cooled from 100° C. to 70° C.). 0.23 g of water and 20 g of PGMEA were mixed and added over 1 hr (the flask still at 70° C.). The silsesquioxane-titania hybrid polymer was diluted with PGMEA to cool, and filtered through a 2.7 μm syringe filter. The theoretical $RSiO_{3/2}$ solids were 12.6 g and the theoretical $TiO_2$ solids are 12.6 g which equates to 50% $TiO_2$/50% $RSiO_{3/2}$. A silicon test wafer was coated with the polymer solution and cured as described in EXAMPLE 1. TEM analysis of a coating of the silsesquioxane-titania hybrid polymer indicates a titanium oxide domain size of less than 3 nm.

Example 8

In a flask 19.34 g of PTMS were mixed with 38 g PGMEA. Water (3 g), methanol (20 g), and concentrated HCl (1.06 g) were pre-mixed and added to the flask over approximately 30 minutes. After the addition, the flask was heated and held at 70° C. for 3 hrs. After holding at 70° C. for 3 hrs a Dean-Stark trap was attached to the flask and the flask was heated to 100° C. where methanol was distilled and collected. The temperature of the material was held for 10 minutes at 100° C. The weight average molecular weight of the resulting silsesquioxane polymer was determined to be about 800 grams per mole by SEC. 125.12 g of tetra-n-butyltitanate (TYZOR® TnBT), 290 g of ethylene glycol dimethylether (EGDME or glyme) and 150 g of PGMEA were combined and added to the flask over approximately 95 minutes while the temperature was allowed to cool to 70° C. After the addition of the titanate and solvents, 80 g of glyme and 1.1 g of deionized water were pre-mixed and added to the flask over approximately 60 minutes at 70° C. The resulting silsesquioxane-titania hybrid polymer solution was heated to 100° C. to remove the glyme. After the glyme was collected, 30 g of PGMEA was added to the silsesquioxane-titania hybrid polymer solution to cool then filtered through a 2.7 μm syringe filter. A silicon test wafer was coated with the polymer solution and cured as described in EXAMPLE 1. TEM analysis of a coating of the silsesquioxane-titania hybrid polymer indicates a titanium oxide domain size of 2-4 nm.

Example 9

In a flask 23.53 g of VTMS were mixed with 38 g of PGMEA. Water (4.9 g), methanol (20 g), and concentrated HCl (1.06 g) were pre-mixed and added to the flask over approximately 30 minutes. After the addition, a Dean-Stark trap was attached to the flask and the flask was heated to 100° C. where methanol was distilled and collected. The weight average molecular weight of the resulting silsesquioxane polymer was determined to be about 1250 grams per mole by SEC. 125.12 g of tetra-n-butyltitanate (TYZOR® TnBT), 290 g of ethylene glycol dimethylether (EGDME or glyme) and 150 g of PGMEA were combined and added to the flask over approximately 95 minutes while the temperature was allowed to cool to 70° C. After the addition of the titanate and solvents, 80 g of glyme and 1.1 g of deionized water were pre-mixed and added to the flask over approximately 60 minutes at 70° C. The resulting silsesquioxane-titania hybrid polymer solution was heated to 100° C. to remove the glyme. After the glyme was collected, 30 g of PGMEA was added to the silsesquioxane-titania hybrid polymer solution to cool, then filtered through a 2.7 μm syringe filter. A silicon test wafer is coated with the polymer solution and cured as described in EXAMPLE 1. TEM analysis of a coating of the silsesquioxane-titania hybrid polymer indicates a titanium oxide domain size of 2-4 nm.

Example 10

45.4 grams of TYZOR® TnBT and 116 grams of ethylene glycol dimethylether (EGDME) were charged to a 0.5 liter flask. The flask was heated to 70° C. and 41.51 grams of ENSEMBLE™ (15.25% solids in PGMEA) silsesquioxane polymer from The Dow Chemical Company having a weight average molecular weight (Mw) of 4800 g/mole were added over 60 minutes. 30 grams of EGDME were pre-mixed with 0.4 grams of deionized water and added to the flask over 60 minutes. The reaction mixture was heated to 100° C. to remove EGDME. After removing the EGDME, heating was discontinued and once the resulting silsesquioxane-titania hybrid polymer solution was cooled to less than 70° C. it was filtered through a 2.7 μm filter to remove any foreign (environmental) particles introduced during synthesis. The final solid content of the silsesquioxane-titania hybrid polymer solution was 37%. An aliquot of the polymer solution was further diluted with PGMEA to a nominal solids loading of 5%. A silicon test wafer was coated with the polymer solution and cured as described in EXAMPLE 1. TEM analysis of a coating of the silsesquioxane-titania hybrid polymer indicated a titanium oxide domain size of 2-4 nm.

Example 11

45.4 grams of TYZOR® TnBT and 116 grams of ethylene glycol dimethylether (EGDME) were charged to a 0.5 liter flask. The flask was heated to 70° C. and 42.2 grams of ENSEMBLE™ (15% solids in PGMEA) silsesquioxane polymer from The Dow Chemical Company having a weight average molecular weight (Mw) of 2500 g/mole were added over 60 minutes. 30 grams of EGDME were pre-mixed with 0.4 grams of deionized water and added to the flask over 60 minutes. The reaction mixture was heated to 100° C. to remove EGDME. After removing the EGDME, heating was discontinued and once the resulting silsesquioxane-titania hybrid polymer solution was cooled to less than 70° C. it was filtered through a 2.7 μm filter to remove any foreign (environmental) particles introduced during synthesis. The final solid content of the silsesquioxane-titania hybrid polymer solution was 34%. An aliquot of the polymer solution was further diluted with PGMEA to a nominal solids content of 5%. A silicon test wafer was coated with the polymer solution and cured as described in EXAMPLE 1. TEM analysis of a coating of the silsesquioxane-titania hybrid polymer indicates a titanium oxide domain size of 2-4 nm.

Example 12

45.4 grams of TYZOR® TnBT and 116 grams of ethylene glycol dimethylether (EGDME) were charged to a 0.5 liter flask. The flask was heated to 70° C. and 18 grams of ENSEMBLE™ (35% solids in PGMEA) silsesquioxane polymer from The Dow Chemical Company having a weight average molecular weight (Mw) of 14000 g/mole were added over 60 minutes. 30 grams of EGDME were pre-mixed with 0.4 grams of deionized water and added to the flask over 60 minutes. The reaction mixture was heated to 100° C. to remove EGDME. After removing the EGDME, heating was discontinued and once the resulting silsesquioxane-titania hybrid polymer solution was cooled to less than 70° C. it was filtered through a 2.7 μm filter to remove any foreign (environmental) particles introduced during synthesis. The final solid content of the silsesquioxane-titania hybrid polymer solution was 36%. An aliquot of the polymer solution was further diluted with PGMEA to nominally 5% solids. A silicon test wafer was coated with the polymer solution and cured as described in EXAMPLE 1. TEM analysis of a coating of the silsesquioxane-titania hybrid polymer indicated a titanium oxide domain size of 2-4 nm.

Example 13

27.8 g of VTMS and 15.9 g of PTMS, 100 g of PGMEA, and 107.2 g of TYZOR® TnBT were charged to a one liter flask. 7 g of 3N acetic acid were added over 1 hr. After the addition, a Dean-Stark trap was attached and the material was heated to 100° C. The material was held at 100° C. collecting alcohols for 4 hrs. The material was then heated to 125° C. and held for 2 hrs (still collecting alcohols). Heating was discontinued and 30 g of PGMEA were added to the resulting silsesquioxane-titania hybrid polymer solution to cool. An aliquot of the polymer solution was then filtered through a 2.7 μm syringe filter and further diluted with PGMEA to nominally 5% solids. A silicon test wafer was coated and cured as described in EXAMPLE 1. TEM analysis of a coating of the silsesquioxane-titania hybrid polymer indicated a titanium oxide domain size of 2-4 nm.

Example 14

27.8 g of VTMS and 15.9 g of PTMS, 250 g of PGMEA, and 107.2 g of TYZOR®TnBT were charged to a one liter flask. 21 g of 3N acetic acid were added over 1 hr. After the addition, a Dean-Stark trap was attached and the material was heated to 125 degrees C. The material was held at 125° C. collecting alcohols for 5 hrs. After 5 hrs at 125° C. the heating was discontinued and 40 g of PGMEA were added to the resulting silsesquioxane-titania hybrid polymer solution to cool. An aliquot of the polymer solution was then filtered through a 2.7 μm syringe filter and further diluted with PGMEA to nominally 5% solids. A silicon test wafer was coated and cured as described in EXAMPLE 1. TEM analysis of a coating of the silsesquioxane-titania hybrid polymer indicated a titanium oxide domain size of 2-4 nm.

Example 15

27.8 g of VTMS and 15.9 g of PTMS, 250 g of PGMEA, and 107.2 g of TYZOR® TnBT were charged to a one liter flask. 26.25 g of 3N acetic acid were added over 1 hr. After the addition, a Dean-Stark trap was attached and the material was heated to 125° C. The material was held at 125° C. collecting alcohols for 5 hrs. After 5 hrs at 125° C. the heating was discontinued and 40 g of PGMEA were added to the resulting silsesquioxane-titania hybrid polymer solution to cool. An aliquot of the polymer solution was then filtered through a 2.7 μm syringe filter and further diluted with PGMEA to nominally 5% solids. A silicon test wafer was coated and cured as described in EXAMPLE 1. TEM analysis of a coating of the silsesquioxane-titania hybrid polymer indicated a titanium oxide domain size of 2-4 nm.

Example 16

13.9 g of VTMS and 7.95 g of PTMS were charged to a one liter flask. 26.5 g of TYZOR® TnBT, 25 g of n-butanol, and 100 g of PGMEA were mixed and added to the flask. 8.25 g of 3N acetic acid were added over 1 hr. After the addition, a Dean-Stark trap was attached and the material was heated to 125° C. The material was held at 125° C. collecting alcohols for 4.5 hrs. Heating was discontinued and 20 g of PGMEA were added to the resulting silsesquioxane-titania hybrid polymer solution to cool. An aliquot of the polymer solution was then filtered through a 2.7 μm syringe filter and further diluted with PGMEA to nominally 5% solids. A silicon test wafer was coated and cured as described in EXAMPLE 1. TEM analysis of a coating of the silsesquioxane-titania hybrid polymer indicated a titanium oxide domain size of less than 3 nm. The theoretical $RSiO_{3/2}$ solids were 12.6 g and the theoretical $TiO_2$ solids were 12.6 g which equates to 50% $TiO_2$/50% $RSiO_{3/2}$.

Example 17

The formulation made in EXAMPLE 2 was diluted with PGMEA to give cast films nominally 900 A thick. This solution was than used to spin-coat a series of samples on 4 inch diameter conductive wafers which were subjected to cure at 200, 300, 325, 350, 375 and 400 degrees Celsius for 2 minutes in nitrogen. The dielectric constants (k) of the resulting films were tested and determined to be 6.2, 9.2, 10.5, 11.5, 11.5 and 12.3, respectively. Thus, the dielectric constant can be tuned by adjusting the cure temperature of the films.

A series of samples were also prepared as described in EXAMPLE 2, except that glyme was used as the solvent during synthesis, and the TnBT-to-silsesquioxane ratios were adjusted to produce samples with nominally 30%, 50% and 70% $TiO_2$ solids. After synthesis, the samples were diluted with PGMEA to nominally 12% solids. The solutions were spin coated as described above except that they were cured in air at 200 degrees Celsius for 2 minutes. The dielectric constants (k) of the resulting films were determined to be 4.6, 6.8 and 13.4, respectively. Thus, dielectric constant can be controlled by controlling as a function of $TiO_2$ content.

Comparative Example

A TiO2 containing polyorganosilicate solution was prepared as described in Example 1 of U.S. Pat. No. 5,100,503. After aging for 1 week the material was cloudy. A small portion was filtered through a 2.7 μm filter. This material was very difficult to filter but the filtrate was clear. Samples of both the unfiltered and 2.7 micron filtered material were submitted for Si and Ti analysis. As shown in Table 3, almost 75% of the Ti phase was removed by the 2.7 μm filter, indicating that a 2-phase system containing gel-like particles was formed. Since the titanium oxide phase was the absorbing phase at higher wavelengths, the absorbance at higher (e.g. 238 nm) wavelengths was expected to be low in films formed from this material.

TABLE 3

| Sample ID | % SiO2 | % TiO2 |
|---|---|---|
| unfiltered | 30.74 | 69.26 |
| 2.7 micron filtered | 81.78 | 18.22 |

CONCLUSION

While the instant invention has been described above according to its preferred embodiments, it can be modified within the spirit and scope of this disclosure. This application is, therefore, intended to cover any variations, uses, or adaptations of the instant invention using the general principles disclosed herein. Further, the instant application is intended to cover such departures from the present disclosure as come within the known or customary practice in the art to which this invention pertains and which fall within the limits of the following claims.

What is claimed is:

1. A method for producing a silsesquioxane-titania hybrid polymer, comprising the steps of: (a) combining an organo-titanate with a silsesquioxane polymer by either (i) adding a solution of an organo-titanate in an aprotic solvent to a solution of a silsesquioxane polymer in an aprotic solvent to form an intermediate, the organo-titanate having the formula $(RO)_4Ti$, wherein R is an alkyl, aryl or alkaryl group having from 1-20 carbons and optionally containing one or more heteroatoms, the silsesquioxane polymer having a weight average molecular weight of at least 2500 per mole or (ii) adding a solution of a silsesquioxane polymer in an aprotic solvent to a solution of an organo-titanate in an aprotic solvent to form an intermediate, the organo-titanate having the formula $(RO)_4Ti$, wherein R is an alkyl, aryl or alkaryl group having from 1-20 carbons and optionally containing one or more heteroatoms and the silsesquioxane polymer has a weight average molecular weight of at least 2500 grams per mole; and (b) adding water to the intermediate to form the silsesquioxane-titania hybrid polymer having titania domains of less than about 5 nm.

2. The method of claim 1, wherein the silsesquioxane polymer comprises alkenyl and aryl groups.

3. The method of claim 2, wherein the alkenyl groups of the silsesquioxane polymer are vinyls.

4. The method of claim 2, wherein the aryl group of the silsesquioxane polymer is phenyl.

5. The method of claim 1, wherein R is n-butyl.

6. The method of claim 1 wherein the solution of silsesquioxane polymer is added to the solution of organo-titanate.

7. The method of claim 6, wherein the silsesquioxane polymer has a weight average molecular weight of less than 30,000 grams per mole.

8. The method of any of claim 6, wherein the silsesquioxane polymer has a weight average molecular weight in the range of from 2,500 to 12,000 grams per mole.

9. A coating comprising the silsesquioxane-titania hybrid polymer made according to the method of claim 1.

10. A method for producing a silsesquioxane-titania hybrid polymer, comprising the steps of: mixing an organo-titanate, one or more organo-silanes, water and acid to form the silsesquioxane-titania hybrid polymer, the organo-titanate having the formula $(RO)_4Ti$, wherein R is an alkyl, aryl or alkaryl group having from 1-20 carbons and optionally containing one or more heteroatoms, the one or more organo-silanes having the formula $X_aSiZ4-_a$ wherein a is 1 or 2 or 3, provided in at least some of the organo-silane a is 1; wherein X is an alkyl, alkenyl, aryl or alkaryl group having from 1-20 carbons and optionally containing one or more heteroatoms; and wherein Z is hydroxy or a hydrolyzable group and can be the same or different in each occurrence on the organo-silane compound.

11. The method of claim 10, wherein the silsesquioxane-titania hybrid polymer comprises alkenyl and aryl groups.

12. The method of claim 11, wherein the alkenyl groups of the silsesquioxane-titania hybrid polymer are vinyls.

13. The method of claim 11, wherein the aryl group of the silsesquioxane-titania hybrid polymer is phenyl.

* * * * *